(12) United States Patent
Varadarajan et al.

(10) Patent No.: US 7,456,102 B1
(45) Date of Patent: Nov. 25, 2008

(54) ELECTROLESS COPPER FILL PROCESS

(75) Inventors: Seshasayee Varadarajan, Lake Oswego, OR (US); Jian Zhou, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 305 days.

(21) Appl. No.: 11/248,860

(22) Filed: Oct. 11, 2005

(51) Int. Cl.
H01L 21/44 (2006.01)

(52) U.S. Cl. .................. 438/687; 438/680; 438/700; 257/E21.17; 257/E21.174; 257/E21.548; 257/E21.549

(58) Field of Classification Search ............... 438/687, 438/680, 681, 678, 688, 905, 700, 706, 745, 438/475
See application file for complete search history.

(56) References Cited

U.S. PATENT DOCUMENTS

| | | | |
|---|---|---|---|
| 4,152,467 A | 5/1979 | Alpaugh et al. | |
| 5,151,168 A | 9/1992 | Gilton et al. | |
| 5,576,052 A | 11/1996 | Arledge et al. | |
| 5,674,787 A | 10/1997 | Zhao et al. | |
| 5,824,599 A | 10/1998 | Schacham-Diamand et al. | |
| 5,891,513 A | 4/1999 | Dubin et al. | |
| 5,913,147 A | 6/1999 | Dubin et al. | |
| 5,969,422 A * | 10/1999 | Ting et al. | 257/762 |
| 5,972,192 A | 10/1999 | Dubin et al. | |
| 6,024,857 A | 2/2000 | Reid | |
| 6,065,424 A | 5/2000 | Shacham-Diamand et al. | |
| 6,136,707 A | 10/2000 | Cohen | |
| 6,197,181 B1 * | 3/2001 | Chen | 205/123 |
| 6,214,193 B1 | 4/2001 | Reid et al. | |
| 6,284,121 B1 | 9/2001 | Reid | |
| 6,527,920 B1 * | 3/2003 | Mayer et al. | 204/237 |
| 6,551,487 B1 * | 4/2003 | Reid et al. | 205/137 |
| 6,664,122 B1 * | 12/2003 | Andryuschenko et al. | 438/17 |
| 6,716,334 B1 | 4/2004 | Reid et al. | |

FOREIGN PATENT DOCUMENTS

WO 99/47731 9/1999

OTHER PUBLICATIONS

Andryuschenko et al., "Electroless and Electrolytic Seed Repair Effects on Damascene Feature Fill," Proceedings of International Interconnect Tech. Conf., San Francisco Ca., Jun. 4-6, 2001, pp. 33-35.

(Continued)

*Primary Examiner*—David Nhu
(74) *Attorney, Agent, or Firm*—Beyer Weaver LLP

(57) ABSTRACT

Disclosed is a procedure for bottom-up fill of electroless copper film in sub-micron integrated circuit features. By repeatedly placing an integrated circuit wafer in an electroless bath, a transient period of time of accelerated growth in the feature is repeated to achieve many small layers of deposition, each of which is thicker near the base of the feature. The net result is filing of the feature from the bottom-up fill without formation of voids. The electroless bath employed to form the continuous electroless copper film may include a reducing agent, a complexing agent, a source of copper ions, a pH adjuster, and optionally one or more surfactants and/or stabilizers.

23 Claims, 11 Drawing Sheets
(7 of 11 Drawing Sheet(s) Filed in Color)

OTHER PUBLICATIONS

Chen et al., "EDC Seed Layer for Inlaid Copper Metallisation," Semiconductor Fabtech—12th Edition, 5 Pages, Jul. 2000.

Ken M. Takahashi, "Electroplating Copper into Resistive Barrier Films," Journal of the Electrochemical Society, 147 (4) 1417-1417 (2000).

T.P. Moffat et al., "Superconformal Electrodeposition of Copper in 500-90 nm Features," Journal of the Electrochemcial Society, 147 (12) 4524-4535 (2000).

Ritzdorf et al., "Electrochemically Deposited Copper," Conference Proceedings ULSI XV 2000, Materials Research Society, 101-107.

Reid et al., "Optimization of Damascene Feature Fill for Copper Electroplating Process," Shipley Company, IITC 1999, 3 Pages.

Reid et al., "Copper PVD and Electroplating," Solid State Technology, Jul. 2000, www.solid-state.com, 86-103.

Reid et al., "Factors Influencing Fill of IC Features Using Electroplated Copper," Adv Met Conf Proc 1999, MRS 10 Pages, (2000).

Shacham-Diamond et al., "Copper Electroless Deposition Technology for Ultr-Large-Scale-Integration (ULSI) Metallization," Microelectronic Engineering 33 (1997) 47-58.

* cited by examiner

ELECTROLESS COPPER FILL PROCESS

BACKGROUND

This invention relates to the formation of Damascene copper interconnects for integrated circuits. More specifically, the invention provides an electroless procedure and conditions for filling features on the surfaces of integrated circuits.

The Damascene or dual Damascene process provides inlaid copper lines in dielectric layers of integrated circuits. The copper lines provide electrical routing between circuit elements in the integrated circuit. In a Damascene process, both copper lines and vias are provided in horizontal layers of dielectric.

The existing process flow used to form the copper lines and blind vias which comprise Damascene or dual Damascene interconnections between integrated circuit devices is typically as follows:

1. Form trench pattern in a dielectric layer on the wafer face using an etch resistant photoresist.
2. Etch features (trenches).
3. Remove resist.
4. Form via pattern in the dielectric layer on the wafer face using an etch resistant photoresist.
5. Etch Vias
6. Remove resist.
7. Deposit a diffusion barrier layer (e.g., tantalum by PVD) and a conductive seed layer (e.g., a copper seed by PVD).
8. Electroplate copper to fill etched features.
9. Polish copper off the wafer face leaving copper filled interconnect circuitry.

As indicated, the Damascene process typically employs physical vapor deposition (PVD) of first a diffusion barrier layer and then a copper seed layer. These layers are deposited in succession into vias and routing lines, pre-etched in dielectric surfaces. Many suitable barrier layers may be employed such as tantalum, titanium nitride, etc. The copper seed layer serves as a conductive substrate unto which bulk copper may be electrodeposited. The seed layer is a thin layer (typically 800-2000 angstroms nominal) that covers the entire face of the wafer, following the sharp contours of the recessed features.

With the barrier and seed layers in place, the electroplating operation can begin. Electroplating fills the etched vias and trenches with copper and continues until the copper forms a continuous sheet over the entire wafer surface. Thereafter, the top portion of the copper is removed from the wafer face to expose the unetched regions of the dielectric layer and leave copper-filled interconnect circuitry.

One limitation of this process sequence is the difficulty in achieving a continuous PVD copper seed layer within high aspect ratio features without causing the features to close off at the top. Understand that as greater and greater quantities of copper seed are deposited by PVD, more complete coverage within a deep feature is attained. But this comes at the expense of pinch-off at the top of the feature, as depicted in FIG. 1. As shown, pinch-off prematurely closes the upper portion (neck) of the trench or via, thereby preventing complete fill of the bottom portions of the feature. Note the void in the top center of the feature, which results from pinch-off.

The PVD process inherently deposits copper on the top or higher regions of a trench or via, thereby creating a narrow neck. This excess of copper at this neck of a recessed feature causes further build up during the subsequent electrodeposition process. Ultimately, the pinch-off region in the initial seed layer blocks further deposition in the lower regions of the feature and leaves a center void within the copper fill of the feature. It is now understood that pinch-off commonly occurs and when it does, it renders void-free filling by electrodeposition nearly impossible. This problem is particularly acute in high aspect ratio features of small width.

Reducing the amount of copper to a level which does not cause pinch-off leads to seed continuity problems near the base of high aspect ratio features as shown in FIG. 2. When the seed is discontinuous near the feature base the copper growth during the electrodeposition process is slow or negligible in these areas. As a result, a large void appears at the base of poorly seeded feature following electrodeposition because the electrodeposition process takes place only above the feature base on areas of thicker seed. The resulting fill profile, showing a void at the feature base following electrodeposition, is also shown in FIG. 2.

Various options intended to provide seed layers suitable for extended Damascene fill by electrodeposition have been described. These include PVD/CVD Cu bilayers, all CVD seed, barrier optimization to improve PVD Cu smoothness at low thickness, atomic layer deposition, wet process seed deposition (Y. Lantasov, R. Palmans, K. Maex, Advanced Metallization Conf. Proc, pp 30-31, Oct. 3-5, 2000), and augmentation of PVD seed using wet processes (L. Chen, T. Ritzdorf, Semicon. Fabtech, July 2000). None of these is entirely suitable.

It is now understood that significant hurdles in copper fill technology must be overcome for future generation Damascene processes.

SUMMARY

The methods disclosed herein address this need by providing a procedure and associated conditions for depositing high-quality electroless copper layers that fill sub-micron recessed features in integrated circuits. The electroless copper layer may be deposited onto a partially completed seed layer, exposed diffusion barrier layers, or other surface materials that would not permit effective electroplating of copper. Thus, the electroless methods disclosed herein may be used as a partial or complete replacement for electroplating as the feature fill process. In accordance with this invention, the copper layer is deposited by a "pulsed" electroless deposition procedure in which integrated circuit is repeatedly contacted with and removed from an electroless plating bath. The plating bath may include a surfactant or similar additive to promote bottom-up filling.

By choosing method conditions that promote bottom-up filling, necking is avoided and void free deposition is promoted. Conditions may also be chosen to allow high deposition rates during the electroless process.

Some methods described herein fill features on a substrate surface having recessed features with a conductive material such as copper. One such method may be characterized by the following operations: (a) providing a substrate having the recessed features; (b) contacting at least the recessed features of the substrate surface with an electroless plating bath and allowing electroless deposition of a conductive material to proceed for a period of time; (c) removing the substrate from the electroless plating bath; and (d) repeating the contacting and removing of (b) and (c) to at least partially fill the recessed features with the conductive material. In integrated circuit applications, the recessed features may be Damascene trenches and vias on a partially fabricated integrated circuit. As indicated, the substrate surface may comprise an exposed diffusion barrier layer or a conductive seed layer that provides discontinuous coverage within at least some of the recessed features.

In certain embodiments, the electroless plating bath includes a reducing agent, a surfactant, and a source of copper ions. The surfactant may be a polyethylene glycol having a molecular weight of between about 200 and 1,000,000, and in some cases between about 2000 and 35,000. In some baths, the polyethylene glycol is present at a concentration of between about 2 and 100 ppm (or between about 2 and 20 ppm). The reducing agent in the bath may comprise an aldehyde moiety; e.g., glyoxylic acid. The electroless plating bath may also include a complexing agent for copper ions. Examples of such complexing agents include ethylenediamine tetraacetic acid (EDTA and salts thereof), pyrophosphate, and ethylenediamine.

The duration of contacting the substrate surface with the plating bath is sometimes referred to as the "pulse length." It is chosen provide a good combination of bottom-up fill and overall rapid deposition. In certain embodiments, the pulse length is between about one-quarter minute and 5 minutes. In certain embodiments, the pulse length is between about one-half minute and 2 minutes. During contact, the substrate may be rotated in the electroless plating bath. After each pulse, the substrate surface may be rinsed and/or dried. Rinsing may be performed with deionized water for example and the drying may be performed with nitrogen for example. After a desired amount of conductive material has been deposited by the electroless process, additional material may optionally be deposited by electroplating the substrate.

Other parameters may be controlled to facilitate electroless filling of the substrate features. Such parameters include bath temperature and pH, mass transfer considerations (stirring the bath, rotating the substrate in the bath, etc.), and number of repetitions of contact and removal. In certain embodiments, the bath temperature is between about 50 and 75° C. (or between about 55 and 70° C.). In certain embodiments, the bath pH is between about 11 and 13 (or between about 11.2 and 12.5). Optimal bath pH may be a function of temperature, with higher temperatures allowing lower pH windows. pH may be adjusted with a non-alkali metal hydroxide such as tetramethylammonium hydroxide.

Also disclosed are methods of filling Damascene features in a partially fabricated integrated circuit, which methods include the following sequence of operations: (a) immersing the partially fabricated integrated circuit in an electroless copper plating bath comprising a polymer suppressing molecule; (b) removing the partially fabricated integrated circuit from the bath after a period of time; (c) re-immersing the partially fabricated integrated circuit in the electroless copper plating bath comprising the polymer suppressing molecule; and (d) again removing the partially fabricated integrated circuit from the bath after a period of time. The immersions may involve contacting only a portion of the integrated circuit containing the Damascene features with the electroless bath.

The remainder of the specification will describe these and other features and advantages of the invention in further detail.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee.

DETAILED DESCRIPTION

Introduction

Figure 1:
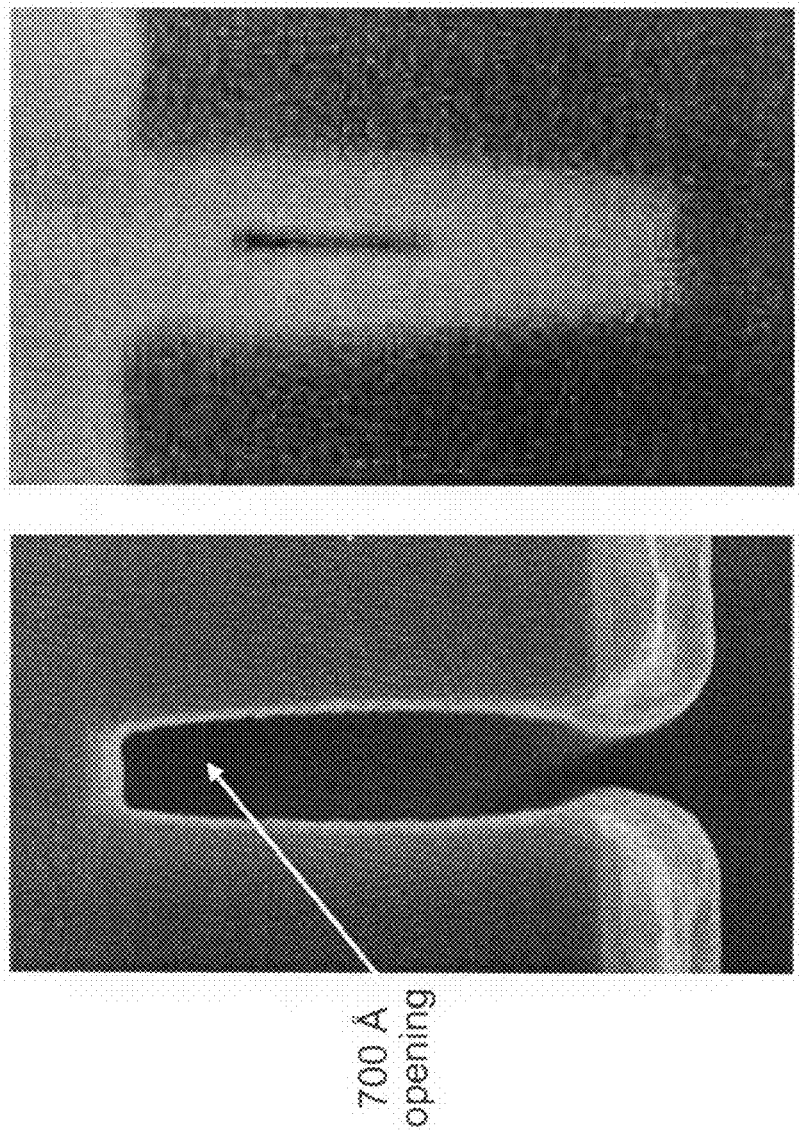
FIG. 1 is a micrograph depicting the problem of pinch off in PVD seed layers of adequate thickness and continuity in high aspect ratio, narrow features.

The disclosed method finds particular application in the formation of Damascene copper interconnects for integrated circuits. A procedure and conditions are disclosed for deposition electroless copper film into sub-micron or micron scale integrated circuit features to fill the features with copper without the presence of voids. The electroless copper film may be deposited onto a previously deposited PVD copper film which may be discontinuous or onto a barrier metal such as tantalum or ruthenium which may be seeded with catalytic species such as palladium. The features are immersed in an electroless copper bath for a period of time, typically 5-300 seconds, removed from the electroless solution, and in some cases rinsed and/or dried, and then re-immersed in the plating bath. The bath may contain additives which suppress the electroless process as they adsorb on the surface. Upon immersion, a transient condition develops inside the feature during which the electroless growth rate inside the feature is faster than that on the surface. After a longer period of time growth rates on all surfaces become equal. By repeatedly placing the wafer in the bath, the transient period of time of accelerated growth in the feature is repeated to achieve many small layers of deposition, each of which is thicker near the base of the feature. The net result is filling of the feature from the bottom-up fill without formation of voids. Several plating equipment configurations to achieve repeated coverage's of the wafer with electroless solutions, each followed by possible rinsing and drying, are described.

The methods find particular usefulness in Damascene processes employing 0.3 micron width and smaller features having aspect ratios of at least about 3:1. Even more aggressively, the invention finds application in 0.2 micron and smaller features having aspect ratios of at least about 6:1. As indicated, the methods employ a pulsed electroless deposition process in which the work piece to be filled is periodically removed from an electroless plating bath and then re-immersed.

Electroless copper deposition has been employed previously as a conformal copper deposition method for various applications. The most frequent industrial application of electroless copper is a formation of thin (100-500 angstroms) conformal copper films within high aspect ratio holes of printed circuit boards to enable subsequent electroplating. In this process, the dielectric surfaces within the holes are coated with a palladium catalyst on which electroless deposition will take place. The circuit board is then placed in an electroless copper bath and the electroless process begins on both the copper coated surfaces of the board and on the palladium coated dielectric. The ability of electroless copper to initiate on non-electrically connected surfaces while forming a surface which is electrically conductive allows the entire printed circuit board surface to then be electroplated.

In another electroless copper industrial application, the entire conductive copper circuitry of a circuit board is formed by electroless deposition. In its process, the ability of electroless copper to deposit conformally on all geometric surfaces is utilized to yield relatively uniform thickness distributions over the surface. This process is described in U.S. Pat. No. 4,152,467, which is incorporated herein by reference for all purposes. In a related process, copper is first sputtered or evaporated on printed circuit board and then deposited by electroless plating. See U.S. Pat. No. 5,576,052 to Arledge et al., which is incorporated herein by reference for all purposes.

Electroless processes have also been used to limited extent in integrated circuit fabrication. Specifically, they have been employed to fill integrated circuit features with copper. See U.S. Pat. No. 5,824,599 issued to Schacham-Diamond et al., U.S. Pat. No. 5,891,513 issued to Dubin et al., U.S. Pat. No. 5,969,422 issued to Ting et al., U.S. Pat. No. 6,065,424 issued to Schacham-Diamond et al., and Materials Electronic Packaging, 1995 p 221-240, each of which is incorporated herein by reference for all purposes. Many subsequent studies found that while electroless copper could be deposited within IC features, the resulting conformal fill tends to leave a center seam or void upon completion of the filling process.

The present invention employs electroless deposition of copper to at least partially fill recessed features of a substrate (e.g., a partially fabricated integrated circuit). One suitable process sequence employing electroless copper deposition in accordance with this invention is depicted in FIG. 3.

The following description assumes that the substrate or work piece to be plated is a wafer, more particularly a semiconductor wafer. The invention is not so limited. The work piece may be of various shapes, sizes, and materials. Generally, any substrate surface having high aspect ratio, narrow width features can be plated with copper in accordance with this invention. In addition to semiconductor wafers, other work pieces that may take advantage of this invention include various conductive articles such as machine tools, recording heads, recording media, and the like.

Figure 3:
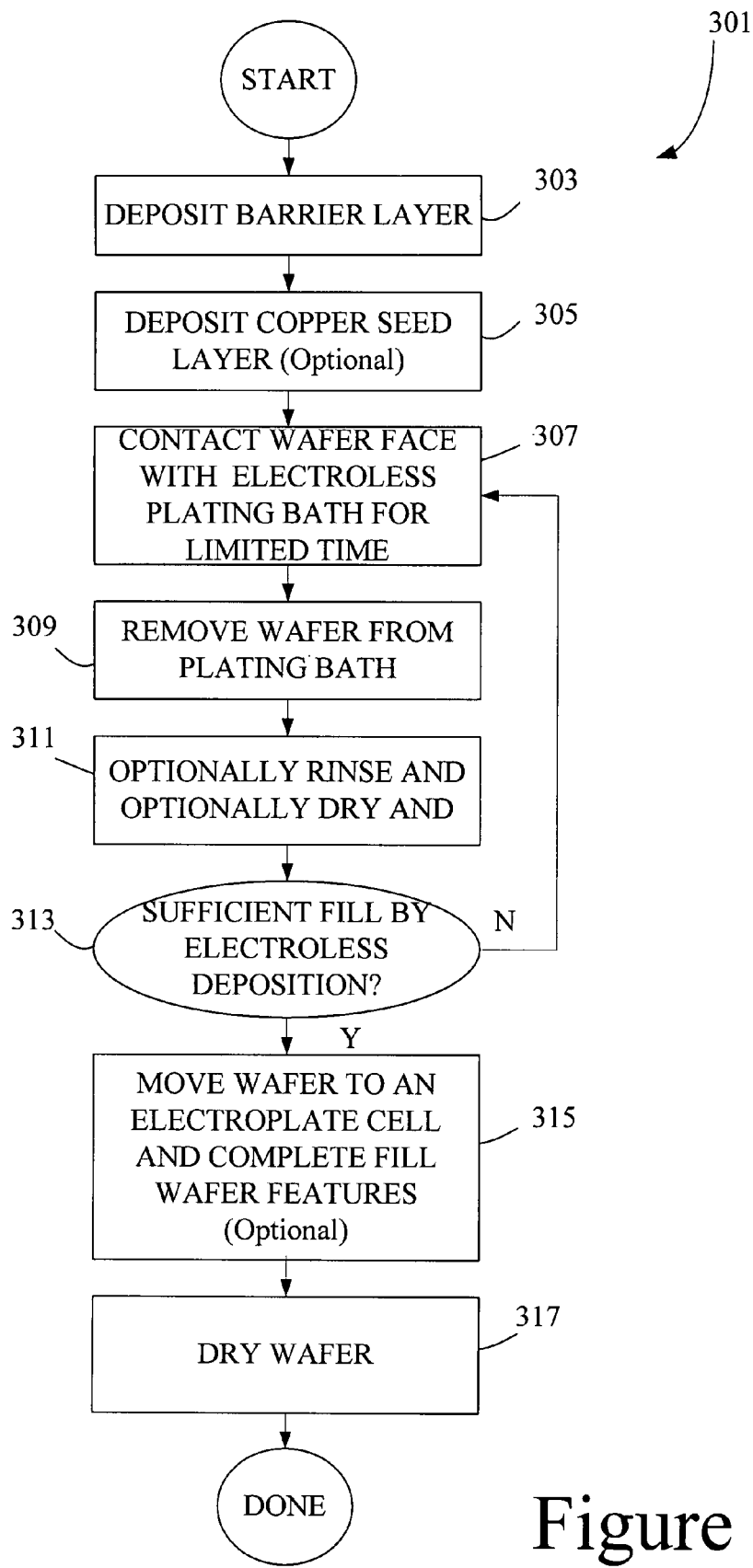
FIG. 3 is a flow chart depicting a pulsed electroless copper fill method in the context of a Damascene process.

As shown in FIG. 3, a Damascene feature filling process 301 begins at block 303 with deposition of a diffusion barrier layer on a Damascene etched dielectric layer to cover the surfaces of interconnect features on a wafer substrate. The barrier layer serves to protect the underlying dielectric material from ingress of copper from subsequently deposited copper lines and interconnects. The barrier may be made from any suitable material such as titanium, tantalum (Ta), tantalum nitride (TaN), tantalum nitride silicon (TaNSi), tungsten (W), titanium (Ti), titanium tungsten (TiW), titanium nitride silicon (TiNSi), ruthenium (Ru), or the like. The barrier layer is conventionally formed by a process such as physical vapor deposition, e.g., sputtering.

Figure 2:
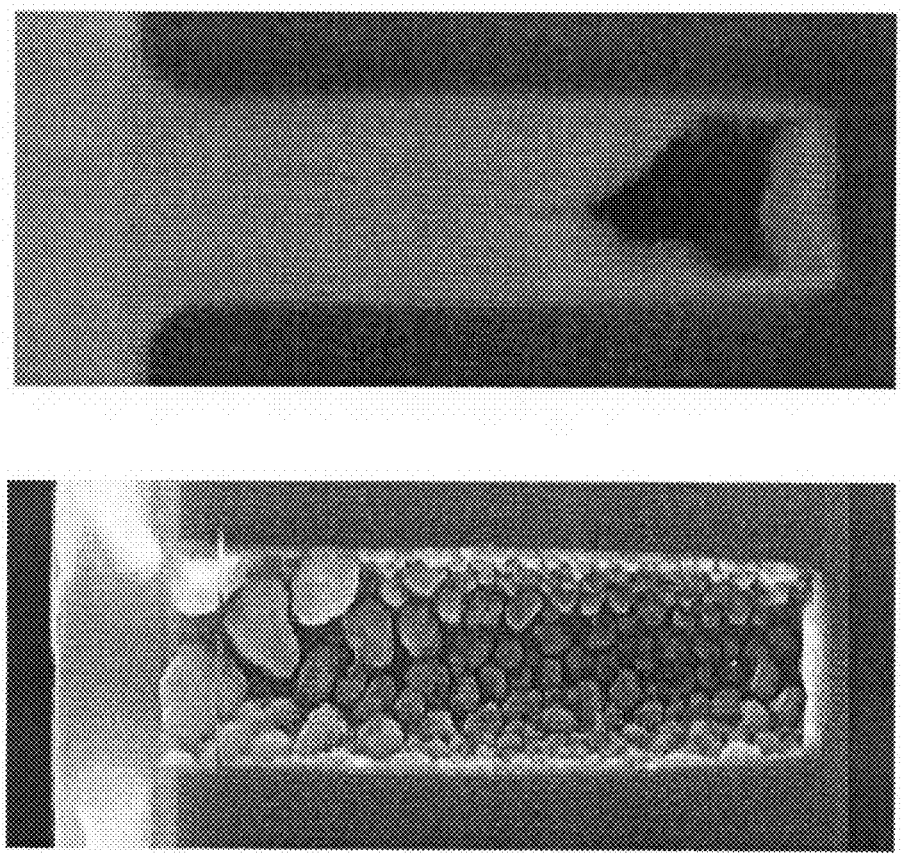
FIG. 2 is a micrograph depicting the problem of thin discontinuous PVD seed layers in high aspect ratio, narrow features.

After the process forms the diffusion barrier layer, a copper seed layer is optionally formed on the barrier layer. See block 305. The seed layer may be formed by PVD or other suitable process such as CVD. The copper seed layer is limited to a thickness in which the copper does not build up excessively at the upper regions of recessed features and thereby promote pinch-off. Often the PVD process will produce a copper layer that is at least partially discontinuous. See FIG. 2. In such cases, the seed layer is inadequate for electroplating and will produce defective copper lines and interconnects.

In process 301 copper fill is accomplished, at least in part, by electroless plating, rather than electroplating. Thus, the next process operation is electroless copper plating. See block 307. Details of this process will be presented below. Generally, the electroless process involves immersing or otherwise contacting the wafer with an electroless copper plating solution for a period of time adequate to deposit a particular thickness of copper, e.g., about 10-500 Angstroms (or about 30-300 Angstroms). This is referred to as a "pulse" of electroless deposition. Multiple electroless pulses are performed during the fill process. In certain examples, the pulse length is between about 30 and 120 seconds. It has been found that electroless fill rate and bottom-up filling are impacted by pulse length.

After the initial electroless pulse is completed, the wafer is removed from the plating bath as depicted in block 309. Once removed from the bath, it may be rinsed and/or dried. See block 311. Rinsing can be performed with deionized water for example. It may be performed to quench the electroless deposition process. Drying can be performed with nitrogen for example. Neither rinsing nor drying is required for the process. It has been found, however, that rinsing with deionized water can have some positive impact on the electroless deposition rate in this method.

In the process flow 301, there is a check operation 313 after each cycle of electroless deposition, which determines whether there has been sufficient total fill of in the substrate features. Assuming that one or more additional cycles of pulsed electroless deposition are required, the process returns to block 307 where the wafer surface is again contacted with the electroless plating bath for a period of time. Thereafter, the wafer is again removed from contact with the bath and optionally rinsed/dried. Ultimately, after a sufficient number of cycles, sufficient copper has been deposited by pulsed electroless deposition. In some embodiments, the pulsed electroless deposition is repeated until a film of about 500-10000 Angstroms is deposited. Obviously, the number of repetitions will depend on the total thickness to be deposited and the amount of copper deposited in each cycle. In a typical case, about 10 to 50 cycles of electroless deposition are performed. Note that different cycles of deposition may be performed for different lengths of time and under different processing conditions (e.g., temperature, bath composition, mass transfer conditions, etc.). For example, initial cycles might be performed with electroless pulses of about 30 seconds at about 60° C. and later cycles might employ pulses of about 90 seconds at about 70° C.

After copper has been deposited to a desired thickness via the electroless process (i.e., the decision at block 313 is answered in the affirmative), the wafer is ready for further processing. This may involve a complete rinse, if no rinse or a limited rinse was performed after the last cycle electroless deposition (block 311). Further, the process may involve a final drying operation. Drying may be beneficial if the wafer is to be stored in a partially filled condition for some length of time (e.g., up to a week). In an optional operation, the wafer is annealed after 311 for the purposes of, e.g., improving grain structure and removing hydrogen incorporated in the film during plating. Anneal conditions are well-known that those of skill in the art. Conditions that would be appropriate for electroplated copper films are also appropriate for electrolessly deposited films of this invention.

After the wafer has been optionally rinsed and optionally dried for the last time, it may be electroplated. Electroplating may be appropriate if the electroless fill process does not completely fill all features on the wafer, e.g., large low aspect ratio features have some volume left unfilled. This optional operation is depicted in block 315, where the wafer is moved to a cell and electroplated. The depicted process is completed with a step of drying the wafer. See block 317. In one embodiment, the electroplating cell is part of a single tool that includes the electroless reaction vessel and the rinse/dry unit. Each of these separate units may be accessed by a single wafer handling robot or group of robots.

Subsequent processing steps are not central to this invention. They may involve planarizing the wafer to remove copper back down to the level of the field regions of the dielectric. Additional dielectric is then deposited to either passivate the device or provide a substrate for a subsequent metallization layer.

A detailed description of a specific embodiment of a pulsed electroless deposition process is provided as follows:

1. Immerse the surface on which electroless deposition is desired in an electroless bath such as that listed below as Bath 1 or Bath 2. The surface may contain circuitized features which are seeded with copper by any means, other catalytic metals, non-catalytic metals derivatized with catalytic species such as palladium, tin, or copper complexes or atoms. Catalytic species facilitate initial nucleation of the metal deposited by the electroless process. The features may be between about 0.010 and 100 micrometers in width or diameter and between about 0.02 and 3 micrometers in depth. The electroless deposition process is selected to proceed at a rate of between about 20 and 400 Angstroms/minute on the surface of the substrate. Polymer additives and their concentrations are selected which slow the rate of electroless deposition at a feature surface but require some period of time between several seconds and several minutes to become effective in slowing the rate of deposition at the bottoms of features.
2. Deposition on the substrate is allowed to proceed for a time of about 5 seconds to 4 minutes, forming a deposited metal (e.g., copper) layer in the features and on the surface of the substrate. Layer thickness can range from about 30 Angstroms to 500 Angstroms. The time of deposition and layer thickness are selected so that deposition takes place at a faster rate inside the features compared to the rate on the substrate surface based on a greater rate of deposition rate suppression due to polymer adsorption on the surface compared to inside the features. Too short a time step results in plating while no surfaces are suppressed by the polymer, while too great a deposition time results in most plating taking place while all surfaces are suppressed by the polymer. A desirable pulse time maximizes plating during the transient period of time when the surface of the substrate is suppressed but the surface inside the feature is not.
3. The substrate is removed for the electroless plating bath. The substrate can be out of the bath for a time between about 0.1 and 100 seconds.
4. The substrate may be rinsed with water or solutions containing some components of the electroless plating bath when it is removed from solution. Examples of solutions that can be used for this purpose include alkaline solutions of some individual components of electroless bath (polymer suppressor, source of the metal that being deposited, or the pH adjuster), solutions with a metal source and associated complexing agent, and solutions with all components of the electroless bath except the reducing agent.
5. The substrate may be dried with air or other gas after it has been rinsed.
6. Re-immerse the substrate in the bath and repeat operations 1-5 until features are filled or deposition is complete.
7. The wafer may optionally be placed in an electroplating bath and electroplated to thicken the copper deposit.

While the present invention can be employed to assist in formation of copper seed layers on any substrate surface having openings, it is particularly advantageous when used with substrates having high aspect ratio, small width openings. Trenches and vias in integrated circuit fabrication are good examples of such openings. In particularly preferred embodiments, the invention is employed with wafer surfaces having trenches and/or vias (or any type of Damascene structure) of aspect ratio about 4:1 or greater; more preferably about 6:1 or greater. Further, some of these features may have a width of not greater than about 0.01 micrometers; or not greater than about 0.1 micrometers. Usually, there will be a range of feature sizes on a given pattern. Small features may range below 0.1 micrometer, or even 0.01 micrometers in width. Larger features may be 2 or more micrometers in size.

Such features/recesses are often formed on dielectric layers of partially fabricated integrated circuits. As indicated above, Damascene processes typically require formation of copper seed layer. Thus, the present invention finds particular applicability in Damascene processes for fabricating integrated circuits.

Note that this application refers to deposition of "copper" layers. The use of "copper" herein refers to pure elemental copper as well as various copper alloys such as copper-aluminum alloys, etc. Generally, to qualify as a copper seed layer, the material should contain at least about 50% atomic copper. Note that the PVD seed layer and the electroless fill may have the same or different compositions. Preferably, each has at least 50% copper.

The Electroless Plating Bath

A variety of electroless bath conditions can be used to obtain adherent copper growth on copper seed or barrier substrates. An electroless bath includes a reducing agent and a source of copper (or whatever metal is being deposited). Other components may include a complexing agent, a pH adjuster, and sometimes surfactants or stabilizers. The components are chosen to meet requirements of the deposition process. For example, components may be chosen to provide minimal void, bottom-up fill with a consistent and reasonably fast (50-500 A/min) rate of reaction at a low temperature.

In certain embodiments, the electroless baths have an alkaline pH. This allows for a negative free energy of the plating reaction, which can be achieved when the half-cell reaction for the reduction reaction $Cu^{2+} \rightarrow Cu(O)$ requires less energy than the half cell reaction for the oxidation reaction (e.g., glyoxylic acid→glyoxylate). The energy required for the reduction reaction varies with pH due to complexation and other factors such that the overall reaction becomes favorable only at alkaline pH values.

Thus, in preferred embodiments of this invention, the pH of the electroless plating bath is greater than 7. More preferably, the plating bath pH lies between about 11 and 13 (most preferably between about 11.2 and 12.5). To adjust the pH, hydroxide is added to the aqueous electroless copper plating solution. Preferably, hydroxide is added in a form that does not include lithium, sodium, or potassium ions (or other ion that can be detrimental to semiconductor device performance). Beyond this, the exact nature of the pH adjuster is not critical to the performance.

At the relatively high pH is required for effective electroless plating, it is possible that copper ions in solution may precipitate out as insoluble copper hydroxide. Obviously, precipitated copper is unavailable for electroless plating on to substrate surfaces. Therefore, steps can be taken to ensure that copper ions remain soluble at the relatively high pHs employed with the electroless baths employed in certain embodiments. To this end, the electroless bath may include a complexing agent. Any complexing agent capable of acting as a ligand for copper ions will be suitable. Examples include ethylenediaminetetraacetic acid (EDTA), pyrophosphates, ethylenediamine, and the like. EDTA has a high stability and high complexation strength.

Considerations for selecting a reducing agent include the rate of reaction and stability of the bath at a given temperature as well as the toxicity of the chosen agent. The reducing agent provides the chemical driving force for reduction of copper ions from the plating bath to neutral copper metal deposited on the substrate surface. The chosen reducing agent should provide a consistent and reasonably fast (approximately 50 to 500 angstroms per minute) rate of reaction at a relatively low temperature. The reducing agent should readily give up electrons at the substrate surface—particularly at the previously deposited portion of the copper seed layer. Unfortunately, many strong reducing agents appear ineffective for this purpose. Aldehyde containing compounds such as formaldehyde, however, have been determined to give good results. A particularly preferred reducing agent is glyoxylic acid, which includes aldehyde and carboxylic acid moieties. Preferably, the aldehyde-containing reducing agent is provided at a molar concentration of between about 0.01 and 0.5 moles/L; more preferably between about 0.02 and 0.3 moles/L.

Surfactants can be added to the electroless copper bath to modify grain structure, improve wetting, improve bath stability, and help displace evolved hydrogen gas. Examples of the suitable surfactants include PEG, PPG, triton X-100, RE610, and the like. In one specific embodiment, polyethylene glycol serves as a surfactant. The "Triton" surfactants available from Rohm and Haas of Philadelphia, Pa. and RE610 available from Rhone Poulenc of Cedex France have been found work as suitable surfactants.

In a preferred embodiment, the concentration of polyethylene glycol in the electroless plating bath ranges up to about 1000 ppm, or between about 2 and 500 ppm, or between about 2 and 20 ppm. Generally, the surfactant should be added in an amount sufficient to effect the desired goals (e.g. good bottom-up filling, wetting, bath stability, etc.). Note that one of the principal difficulties observed in electroless deposition of copper is blistering caused by accumulated hydrogen at the interface within the deposit. The addition of surfactants to the plating bath seems to reduce the incidence of and severity of hydrogen-based blistering.

Other additives include cyanide and certain metal salts such as salts of lead and arsenic that modify the plating surface by adsorbing thereto.

A source of copper ions (e.g. a copper salt) must be added to the electroless bath. The copper ions can be added as a variety of salts such as copper sulfate pentahydrate, cupric chloride, etc. The concentration of copper ions may be between about 0.5 and 10 g/L; or between about 1 and 4 g/L. The amount of complexing agent added to the electroless bath is a function of the concentration of copper salt in the bath. Generally, the amount of complexing agent should be sufficient to complex all of the copper ions initially present in the bath (except as defined by the stability of the product of $Cu^{2+}$ and the complexing agent). Thus, the molar amount of complexing agent should be comparable to, or slightly in excess of, the molar amount of copper.

In specific examples, pulsed electroless baths have the following compositions.

Bath 1:

5-30 g/L EDTA pH 11.2-13

2-20 g/L glyoxylic acid 0.5-4.0 g/L copper metal 2-500 parts per million PEG MW between 200 and 150,000

Temperature 50-75C.

Bath 2:

14 g/L EDTA pH 12-5-12.8

6.5 g/L glyoxylic acid 1.25 g/L copper metal 100 parts per million PEG 4600

Other Electroless Process Parameters

Temperature and flow conditions can impact the rate of electroless deposition. They can be controlled to vary plating rate and enhance uniformity, wetting, and displacement of hydrogen generated during deposition.

In certain embodiments, the electroless bath temperature is within a window of between about 50 and 80 degrees C., or between 55 and 70 degrees C. In some applications, temperatures outside these ranges can be problematic. If the temperature is too low, the plating rate may be too slow, while if the temperature is too high, the plating bath can become unstable and plating occurs too readily and in an uncontrolled manner, even plating on the plating apparatus and other locations where it is undesirable. It has been found that, on balance, electroless fill using methods described herein has no strong dependence on temperature. Nevertheless, it has been observed that bath temperatures at the higher end of the acceptable range provide higher fill rates, while temperatures at the bottom end of the range provide better bottom-up fill in small features (e.g., 0.12 micrometers).

Further, one way to achieve uniform deposit thickness across the wafer surface is maintain a consistent temperature and flow condition across the wafer surface. This may be achieved by ensuring that the plating solution is consistently well mixed. Hence a suitable electrolyte flow rate may be maintained across the wafer surface. To this end, the wafer may be rotated, the electrolyte may be separately agitated, and/or the electrolyte may be forced to flow over the wafer surface. Nevertheless, in simple experiments, it has been found that forced mass transfer through stirring has little if any effect on fill parameters (rate of deposition and bottom-up fill).

It has also been found that in baths containing surfactants and polyethylene glycol the effect of flow on the plating rate is complex. It is believed that this is because the surfactant can accumulate at the surface being plated and slow the rate of the process. The result of this behavior is that a high flow condition in a bath containing a stabilizing surfactant will result in a plating rate, which decreases with time. Typical results in a stabilized surfactant containing bath (Bath 2 above) are shown below.

TABLE 1

| Flow | Deposition time | Temp (° C.) | Deposit thickness (Å) |
|---|---|---|---|
| None | 4 min | 65 | 252 |
| Slight | 4 min | 65 | 192 |
| High | 4 min | 65 | 132 |

Apparatus

The apparatus employed in the electroless fill processes of this invention can impact the quality of the resulting copper layer and the efficiency of the process. The apparatus can control the flow, temperature, and wetting dependence of the electroless process. Each of these parameters impacts the final quality of the deposited copper layer. The apparatus may also be designed to monitor the state of the electroless deposition process. The apparatus may also be designed to provide contact between the electroless bath and the wafer by one or more of various techniques including partial immersion, full immersion, spraying, etc.

Various apparatus configurations can meet the requirements for good electroless plating. A "clamshell" fixture which seals the wafer backside from the plating solution while allowing plating to proceed on the wafer face can be used. Such fixtures either support the wafers via a seal placed over the bevel of the wafer or by means such as vacuum applied to the back of the wafer along with seals applied near the bevel. Clamshell designs for electroplating copper onto semiconductor wafers are described in U.S. Pat. Nos. 6,156,167 and 6,139,712 (incorporated herein by reference for all purposes). A clamshell design has been employed in commercial electroplating apparatus available from Novellus Corporation of San Jose, Calif. (the SABRE™ clamshell electroplating apparatus). Using the clamshell configuration, a wafer can rapidly be immersed and removed from the bath to yield process consistency across the full wafer. Existing hardware designs for plating cells allow sequential rinsing and drying of wafers between plating steps (See U.S. Pat. No. 6,214,193 and U.S. Pat. No. 6,716,334, both incorporated herein by reference).

Figure 4:
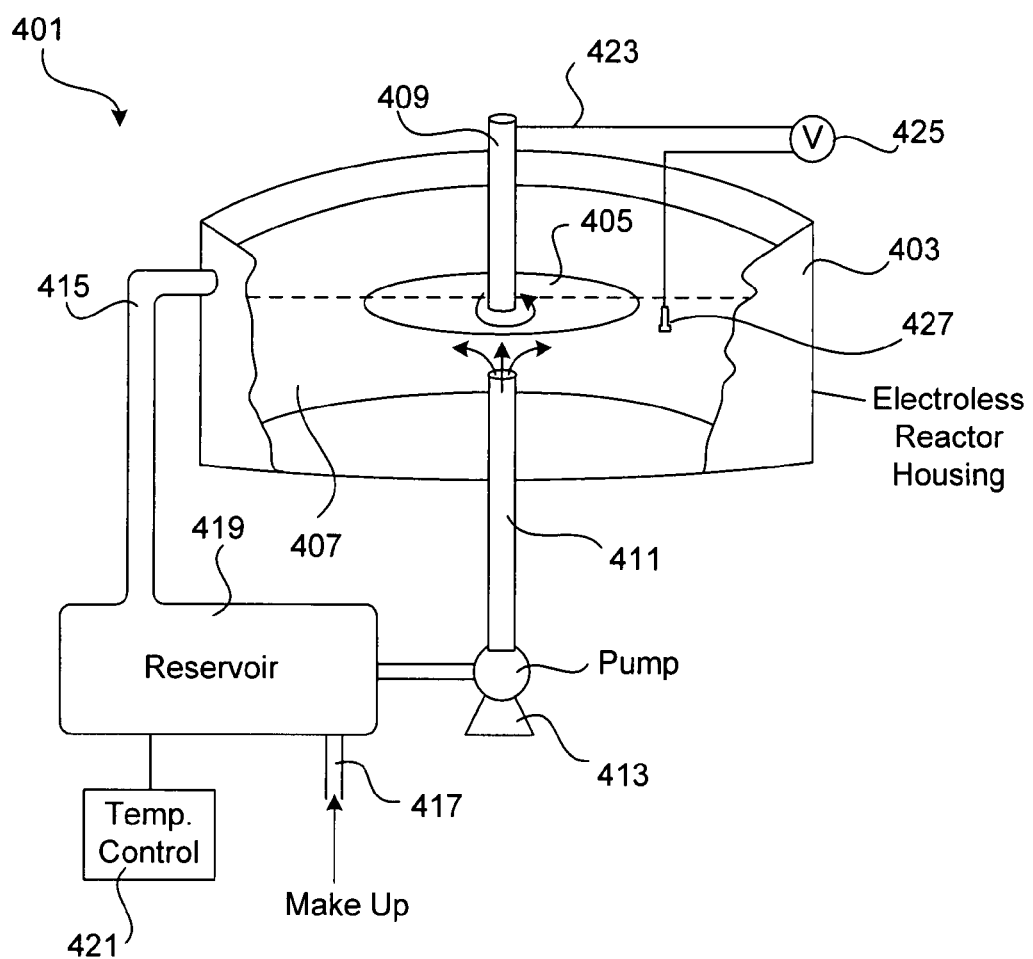
FIG. 4 is a schematic illustration of an electroless plating apparatus suitable for electroless fill in accordance with this invention.

FIG. 4 depicts in schematic fashion a suitable apparatus for use with this invention. The apparatus includes general systems/components for housing the electroless plating solution, flowing electroless plating solution over the wafer, temperature control, and confirming that deposition is proceeding at a non-negligible rate. Optionally, the apparatus also monitors the thickness of the copper layer by measuring resistivity, for example.

1. Reactor Vessel

The plating cell itself may be a cylindrical container with a volume adequate to maintain thermal stability when a wafer in, e.g., a clamshell is place in the bath. In the embodiment depicted in FIG. 4, a plating cell 401 includes a cylindrical container 403 with a volume adequate to maintain thermal stability when a substrate (wafer) 405 is held in place in a bath 407. In a specific embodiment, the plating cell volume ranges from about five to eight liters. This is adequate for plating 200 millimeter and 300 millimeter semiconductor wafers. While not shown in this figure, wafer 405 is held in a wafer holder such as the above referenced clamshell wafer apparatus.

2. Flow/Agitation

Various approaches to flow and agitation of the electroless bath with respect to the substrate being plated may be employed. As suggested above, some embodiments may employ little if any agitation. In embodiments that employ agitation, the apparatus may include mechanisms for rotating the wafer, flowing bath through the reactor, and/or stirring the bath.

The wafer enters the bath in a way allowing good wetting of the face-down wafer surface. This may be achieved by a combination of clamshell rotation, vertical entry speed, and the angle of the clamshell relative to the surface of the plating bath. An angle of about 1-10 degrees, a vertical speed of about 5-200 mm/sec, and a rotation rate of about 5-125 RPM at the beginning of the process is desirable to fully displace air from the wafer surface (See e.g., U.S. Pat. No. 6,551,487 by Reid et al., issued Apr. 22, 2003, and incorporated herein by reference). Once the process begins, the apparatus will be able to modulate flow at the wafer surface. This can be achieved by decreasing the rotation rate once the process begins to a value of 5-50 RPM. It should be noted that no other method of agitation is required in this invention, although some flow capability into and out of the plating cell may be provided for and can be part of the temperature control mechanism of the apparatus.

During the main electroless plating operation, the wafer may remain tilted at an angle of about three to ten degrees or it may be tilted back to horizontal, as depicted in FIG. 4.

The substrate and associated holder rotate under the control of a rotation actuator 409. Details of suitable actuators and associated mechanisms for controlling substrate rotation and angular orientation are described in the above-mentioned U.S. Pat. No. 6,551,487. While the apparatus described in that application is geared toward and electroplating apparatus, many structural and functional aspects of the design can be applied to electroless plating systems of this invention.

As shown in FIG. 4, reactor 401 includes an electrolyte flow system that directs electrolyte onto substrate 405 by pumping it into the reactor via an inlet tube 411. A pump 413 delivers the electrolyte. In the depicted embodiment, the electrolyte circulates through reactor 401 via an outlet line 415 and the inlet line 411. The outlet from the reactor may take many different forms. Some of these are described in U.S. patent application Ser. No. 09/872,340 filed May 31, 2001 (METHODS AND APPARATUS FOR BUBBLE REMOVAL IN WAFER WET PROCESSING), and U.S. Pat. No. 6,527,920 by Mayer et al. issued Mar. 4, 2003 (COPPER ELECTROPLATING METHOD AND APPARATUS), both of which are incorporated herein by reference for all purposes.

As reactant is consumed during the electroless plating operation, some fresh make up solution may flow into the recirculation loop via a make up line 417. Generally, the make up solution is provided as needed. Given that the plating rate should be relatively constant and that consumption of electroless bath components should be relatively constant, make up solution can be added on a regular schedule. In one embodiment, copper salt and any other consumable are added following a set time or substrate count.

3. Temperature Control

As indicated, the solution temperature is preferably maintained in a range of between about 50-80° C. To adequately control temperature in this range, a heating system may be require. Heating may be accomplished by directly placing a heat exchanger unit in the plating cell or by recirculating some portion of the flow through a heating unit, or various other means known to those of skill in the art. Backside heating of the wafer during immersion in the electroless bath can also be used to increase the rate of deposition at the wafer surface while maintaining the bulk plating solution at a lower temperature at which it is more stable.

In the depicted embodiment of FIG. 4, a reservoir 419 holds a supply of electroless plating solution. The temperature of the solution in reservoir 419, and hence in reactor 401, is controlled by a temperature controller 421, which may include one more heat exchangers, thermocouples, or other temperature sensors.

4. Monitoring the Electroless Plating Process

In order to confirm the activity of the electroless process the voltage of the wafer surface may be measured relative to a reference electrode. The potential between a reference electrode any substrate undergoing a chemical reaction in an electrolyte is given by thermodynamic half cell reactions taking place at each electrode (the substrate serving as one electrode in a galvanic cell), as well as the reaction kinetics and mass transfer to the surfaces. If the reaction at the substrate changes during deposition, then the potential versus the reference electrode will also change.

In the depicted embodiment, an electrical connection 423 is made to the substrate 405. This connection allows input to a high impedance voltmeter 425. The voltmeter is also connected to a reference electrode 427 that is immersed in the electroless bath 407. In certain embodiments, the voltage measured between a saturated calomel reference electrode and the substrate will measure about −0.5V when the wafer is immersed in the bath. Once the electroless process begins the voltage will shift to approximately −0.7 to −0.8V. This voltage will be maintained as long as the process continues at a non-negligible rate. If the voltage drops back to −0.5 to −0.6V it is an indication that the plating rate of the electroless bath has diminished to near zero. When the system detects that the voltage has reached a problematic region, the process is halted for further evaluation or correction.

EXAMPLES

Experimental work has evaluated bath conditions for electroless pulse parameters to determine their effect on bottom-up fill and fill rate using a specific bath composition. Among the parameters tested were pulse frequency or pulse length, PEG concentration, PEG molecular weight, and bath temperature. In each case, the basic bath chemistry employed an aqueous solution of 6.75 g/L $CuSO_4.5H_2O$, approximately 18 g/L EDTA (ranging between about 18.12 and 18.20 depending on the experiment), 6.5 g/L glyoxylic acid, and a pH of 12. Pulsed electroless deposition of copper using these solutions was performed on dielectric substrates having etched trenches ranging in width from 0.15 μm to 2.0 μm and on dielectric substrates having etched vias of widths 0.12 μm, 0.13 μm, and 0.14 μm. The substrates had a conformal copper seed layer of 1500 Å (trenches) and 800 Å (vias) deposited by PVD.

After the pulsed deposition was completed, SEMs of the substrate cross-sections were made. The resulting images show the quality of the bottom-up fill (whether seams or voids are present) as well as the fill rate (thickness of the copper deposit). The SEMs show copper (light gray) on top of dielectric substrate (darker). Seams and voids are visible as darker regions in the copper fill within the trenches and vias. A dark wavy line over the deposited copper is platinum deposited for the SEM. It represents the top surface of the deposited copper.

Figure 5A:
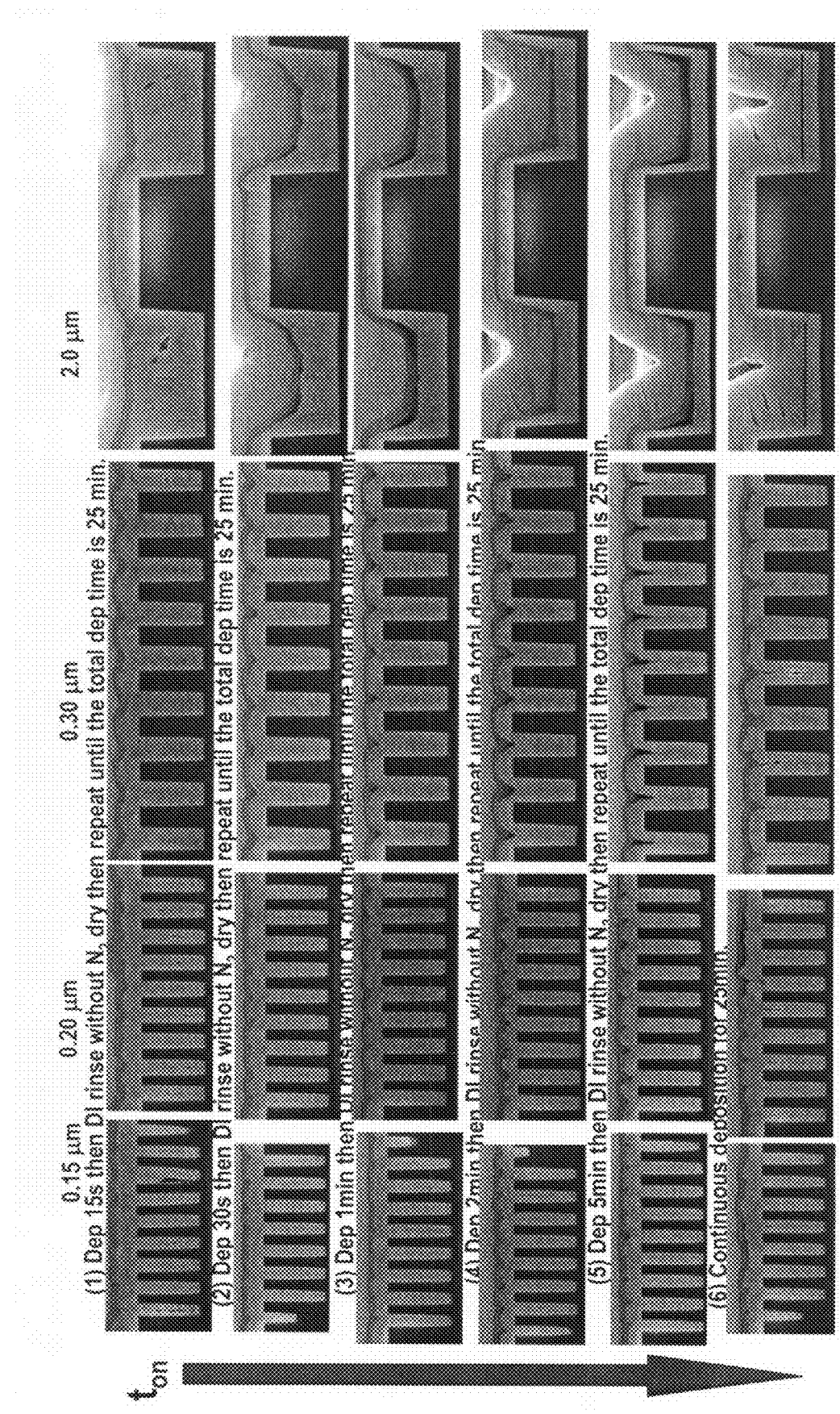
FIGS. 5A and 5B are SEM cross-sections showing the effects of electroless pulse length on copper fill in trenches (0.15 μm, 0.20 μm, 0.30 μm, and 2.0 μm) and in vias (0.12 μm, 0.13 μm, and 0.14 μm).
Figure 5B:
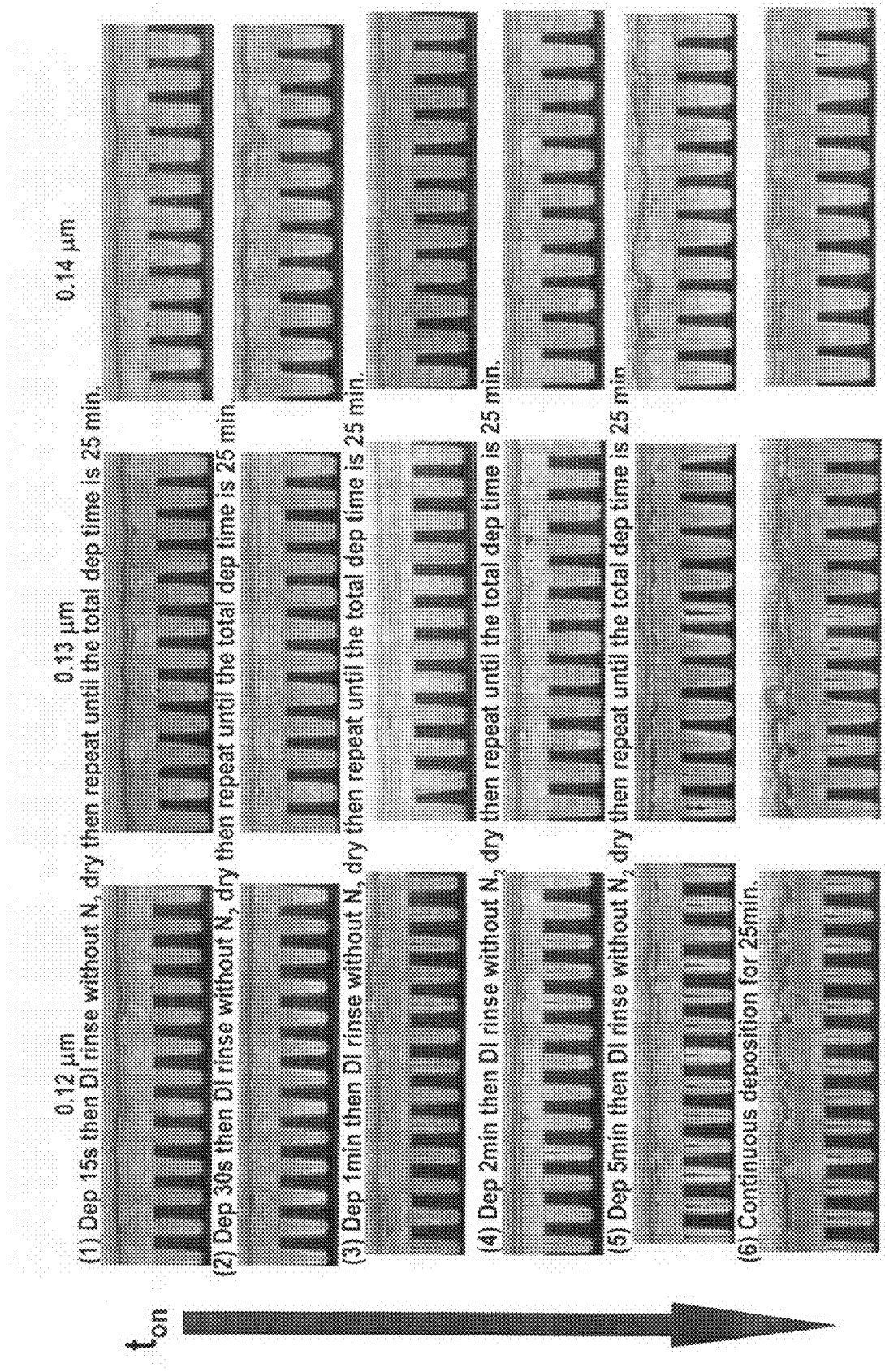

FIGS. 5A and 5B are SEM cross-sections showing the effects of electroless pulse length or "on time" on copper fill in trenches (0.15 μm, 0.20 μm, 0.30 μm, and 2.0 μm) and in vias (0.12 μm, 0.13 μm, and 0.14 μm). In addition, to the components listed above, the bath contained 10 ppm PEG 35,000 and was maintained at a temperature of 65° C. 18.20 g/L of EDTA were employed. As shown, the on times were 15 seconds, 30 seconds, 1 minute, 2 minutes, 5 minutes, and 25 minutes continuous deposition (a control). The substrate features were washed with deionized water but not dried between immersion cycles. As can be seen in FIG. 5A, the fill rate in trenches increases with decreasing pulse on time. For example, the 2 micron trenches are nearly completely filled with copper in the 15 second pulse time. With increasing pulse on times, the amount of fill steadily decreases. In both the trenches of FIG. 5A and the vias of FIG. 5B, the quality of the fill (representing good bottom-up characteristics) was best in experiments with pulse times of 30 seconds to 2 minutes. As deposition cycle time increases to 5 minutes, growth in the large trenches becomes conformal and large center seams are seen in the 0.12 μm vias.

Figure 6A:
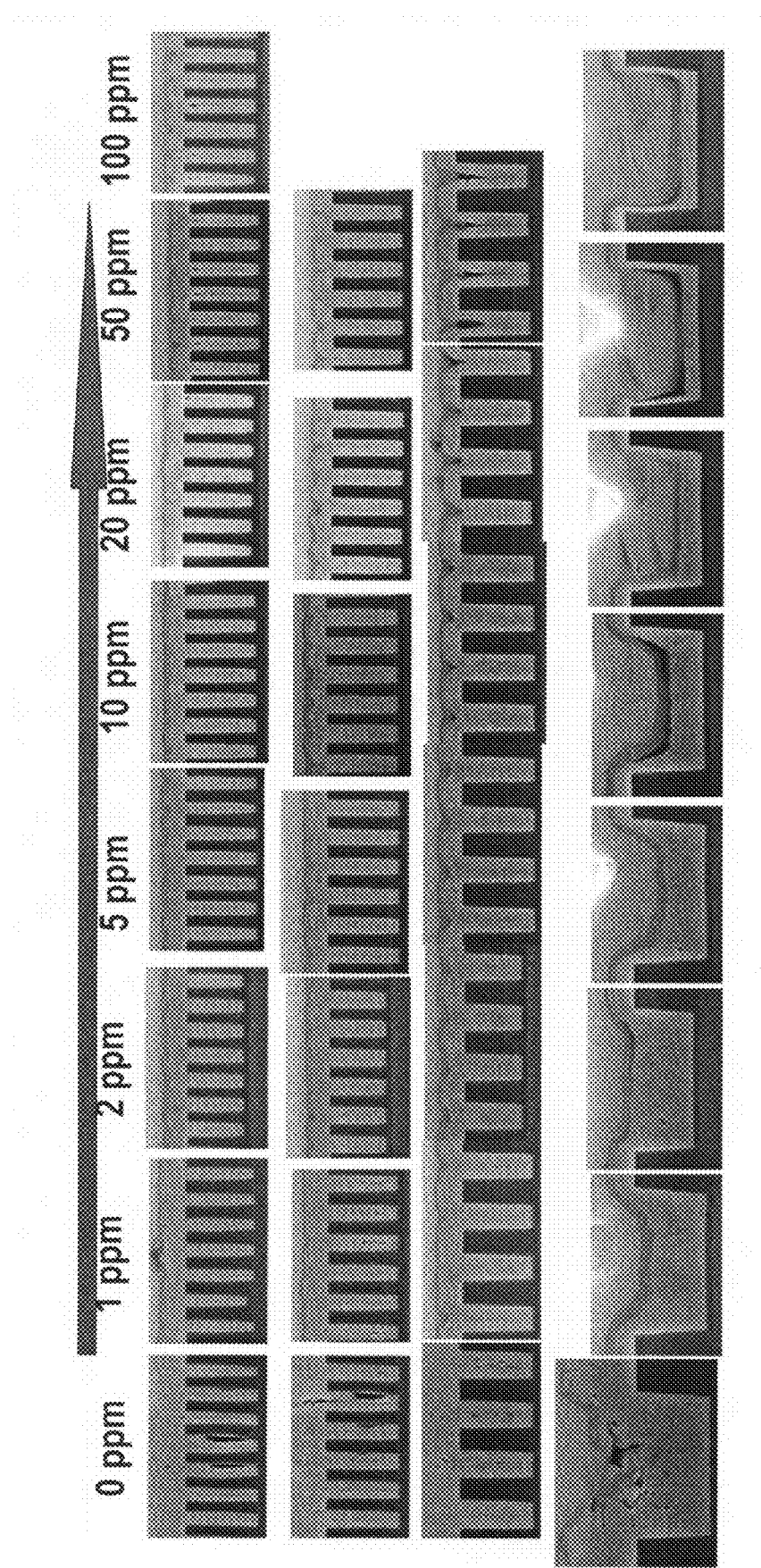
FIGS. 6A and 6B are SEM cross-sections showing the effects of PEG concentration on copper fill in trenches (0.15 μm, 0.20 μm, 0.30 μm, and 2.0 μm) and in vias (0.12 μm, 0.13 μm, and 0.14 μm).
Figure 6B:
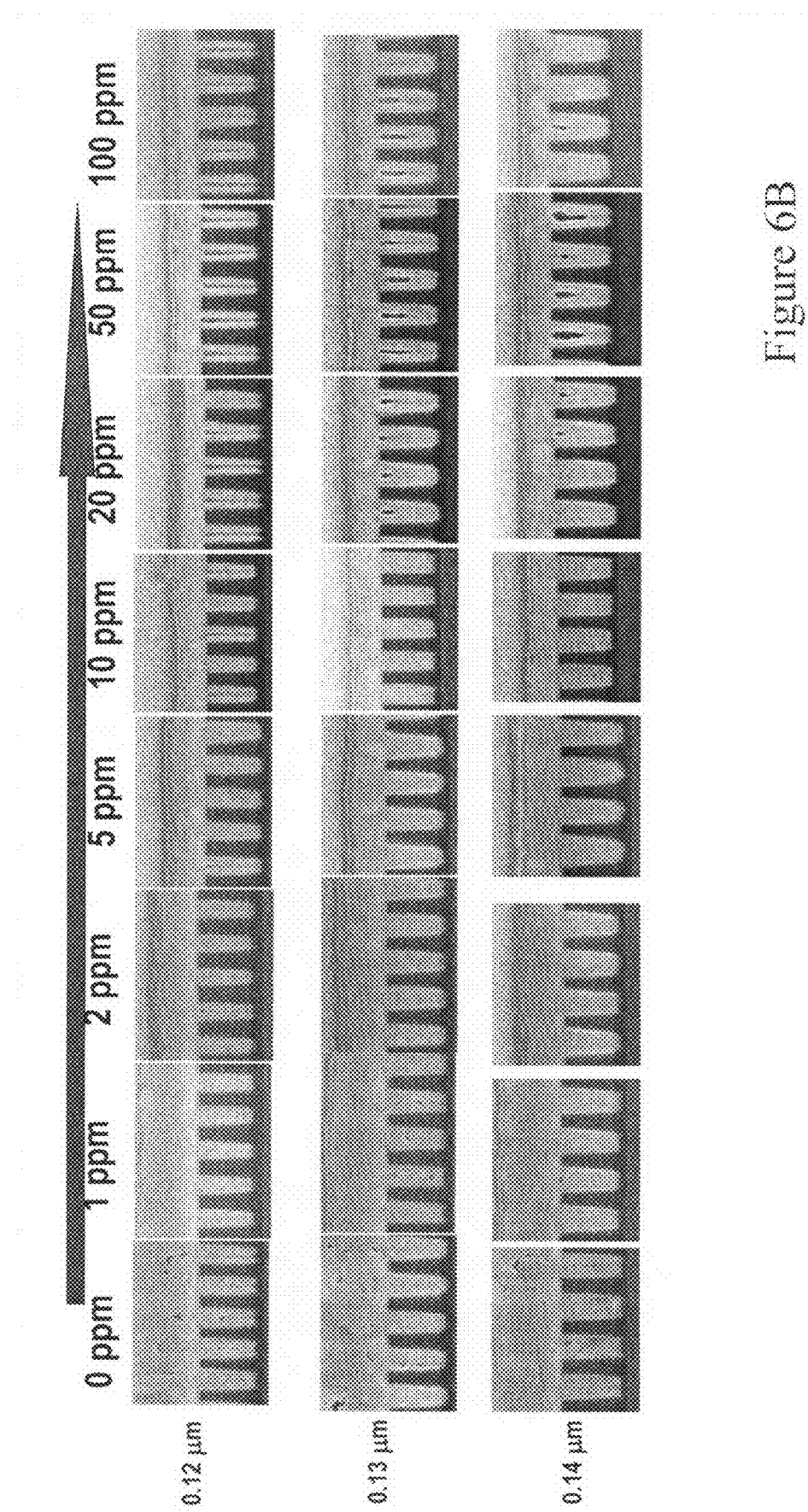

FIGS. 6A and 6B are SEM cross-sections showing the effects of PEG concentration on copper fill in trenches (0.15 μm, 0.20 μm, 0.30 μm, and 2.0 μm) and in vias (0.12 μm, 0.13 μm, and 0.14 μm). As shown, the PEG concentrations were 1 ppm, 2 ppm, 5 ppm, 10 ppm, 20 ppm, 50 ppm, and 100 ppm. The PEG molecular weight was 35,000 and 18 g/L EDTA was used. The bath temperature was maintained at 65° C. As can be seen, the fill rate inside features decreases with PEG concentration and best bottom-up fill is found at intermediate concentrations, 2-20 ppm or 2-10 ppm.

Figure 7:
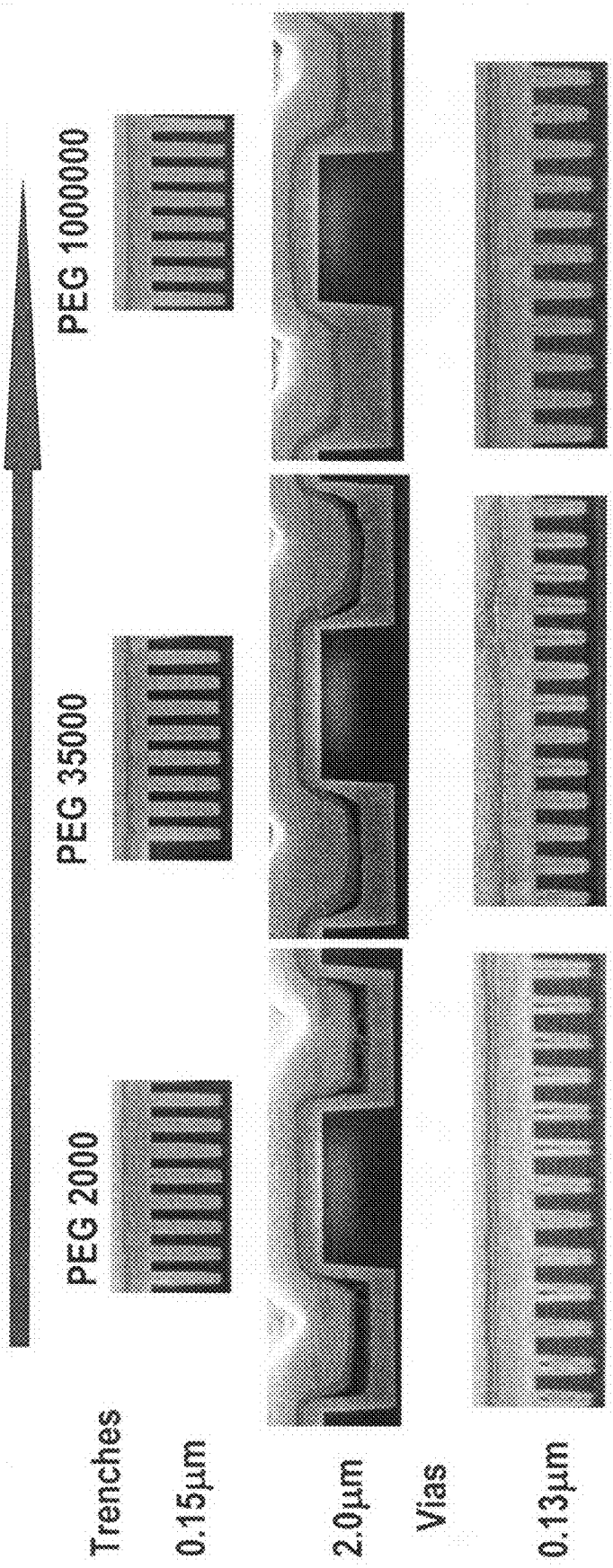
FIG. 7 is an SEM cross-section showing the effects of PEG molecular weight on copper fill in trenches (0.15 μm and 2.0 μm) and in vias (0.13 μm).

FIG. 7 is an SEM cross-section showing the effects of PEG molecular weight on copper fill in trenches (0.15 μm and 2.0 μm) and in vias (0.13 μm). As shown, the PEG molecular weights were 2000, 35,000, and 1,000,000. In all cases, the PEG concentration was 10 ppm. The bath temperature was maintained at 65° C. As can be seen, there is essentially no bottom-up fill in 2.0 μm trenches at molecular weight 2000. In general, the bottom-up fill rate increases with increasing molecular weight.

Figure 8A:
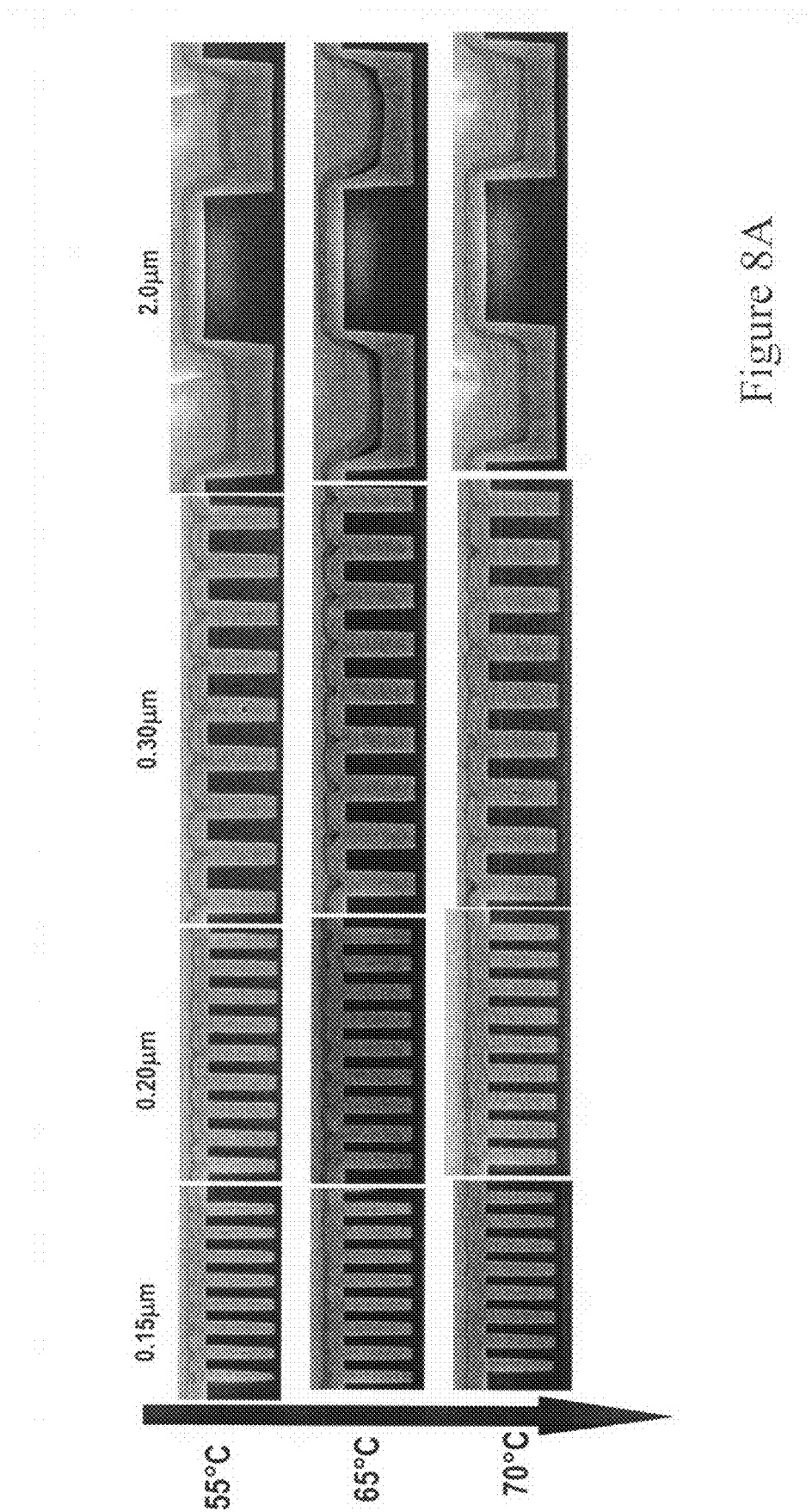
FIGS. 8A and 8B are SEM cross-sections showing the effects of bath temperature on copper fill in trenches and in vias.
Figure 8B:
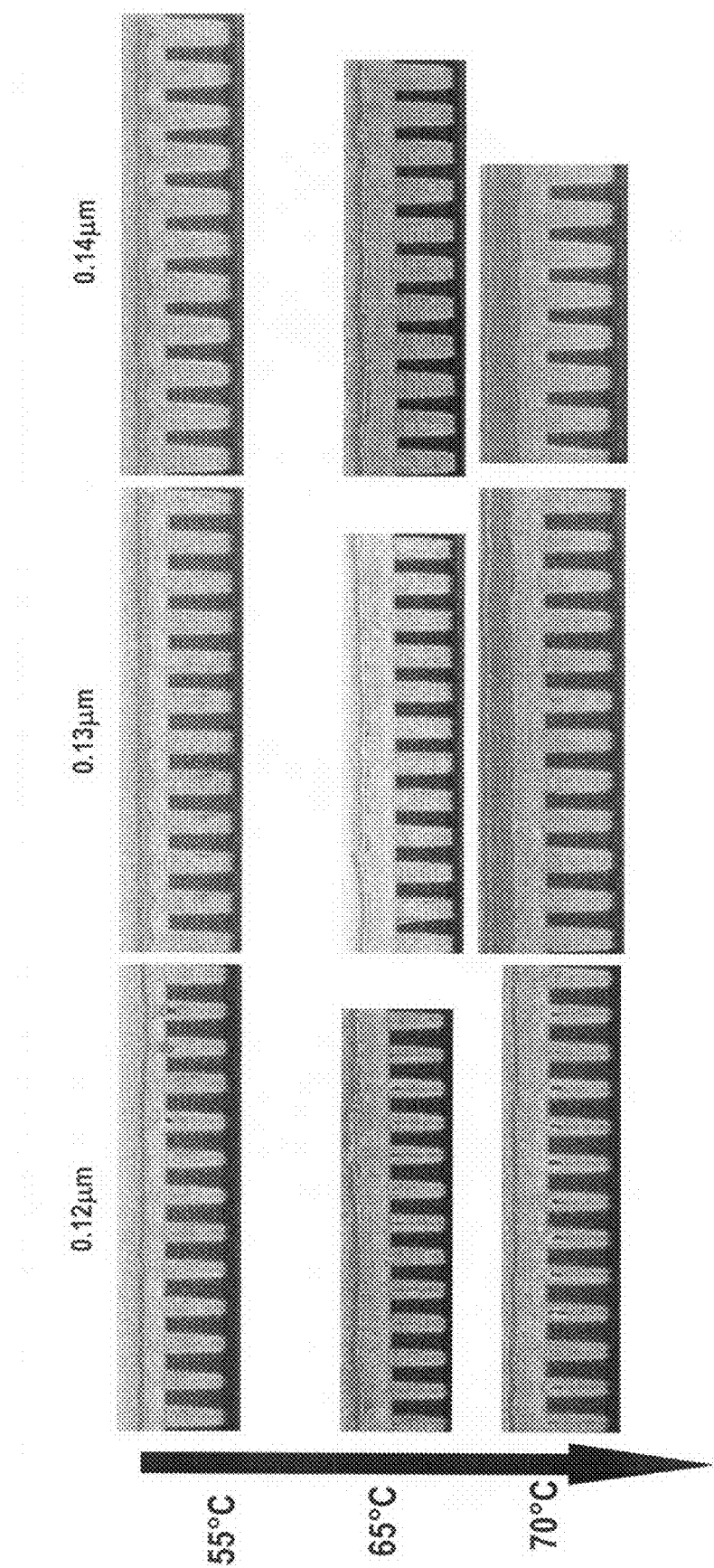

FIGS. 8A and 8B are SEM cross-sections showing the effects of bath temperature on copper fill in trenches (0.15 μm, 0.20 μm, 0.30 μm, and 2.0 μm) and in vias (0.12 μm, 0.13 μm, and 0.14 μm). The bath employed 10 ppm PEG 35,000 and 18.12 g/L EDTA. A deionized water rinse was used after each immersion cycle with no drying. As shown, the bath temperatures were 55° C., 65° C., and 70° C. As can be seen, temperature did not have a strong effect on trench fill. However, for via fill, higher temperatures resulted in faster fill rates. Further, better bottom-up fill was observed at lower temperatures for 0.12 μm vias. There did not appear to be a strong effect on fill of 0.13 and 0.14 μm vias.

In some experiments, it has been observed that best filling is seen when the substrate is removed from the bath and rinsed or rinsed and dried between plating segments. It has also been observed in some experiments that when no polymer or suppressing molecule is present in the plating solution there is little or no improvement in the filling performance when the plating is broken into segments.

Other Embodiments

Although various details have been omitted for clarity's sake, various design alternatives may be implemented. For example, while the concept of sequential plating in solutions in which gradual adsorption of current suppressing species to achieve bottom-up fill has been described as applicable to deposition with electroless copper to fill integrated circuit interconnects, a number of other application are possible. These include other electroless metal or metal alloy deposition processes such as silver, gold, nickel and cobalt, and metal or metal alloy electroplating processes such as copper, silver, gold, tin, nickel, cobalt. Therefore, the present examples are to be considered as illustrative and not restrictive, and the invention is not to be limited to the details given herein, but may be modified within the scope of the appended claims.

What is claimed is:

1. A method of filling features on a substrate surface, the method comprising
   (a) providing a substrate having recessed features formed on a surface thereof;
   (b) contacting at least the recessed features of the substrate surface with an electroless plating bath and allowing electroless deposition of a conductive material to proceed for a first period of time;
   (c) removing the substrate from the electroless plating bath; and
   (d) repeating the contacting and removing of (b) and (c) to at least partially fill the recessed features with the conductive material.

2. The method of claim 1, wherein the recessed features comprise Damascene trenches and vias on a partially fabricated integrated circuit.

3. The method of claim 1, wherein the substrate surface comprises an exposed diffusion barrier layer.

4. The method of claim 1, wherein the substrate surface comprises a conductive seed layer that provides discontinuous coverage within at least some of the recessed features.

5. The method of claim 1, wherein the electroless plating bath comprises a reducing agent, a surfactant, and a source of copper ions.

6. The method of claim 5, wherein the surfactant is a polyethylene glycol having a molecular weight of between about 200 to 1,000,000.

7. The method of claim 6, wherein the polyethylene glycol is present in the electroless plating bath at a concentration of between about 2 and 100 ppm.

8. The method of claim 5, wherein the reducing agent comprises an aldehyde moiety.

9. The method of claim 5, wherein the electroless plating bath further comprises a complexing agent for copper ions.

10. The method of claim 1, wherein the first period of time, during which the recessed features are contacted with the plating bath in (b) has a duration of between about one-half minute and 2 minutes.

11. The method of claim 1, wherein the electroless plating bath has a pH of between about 11 and 13.

12. The method of claim 11, wherein the pH adjuster is tetramethylammonium hydroxide.

13. The method of claim 1, wherein the electroless plating bath has a temperature of between about 50 and 70 degrees C. while contacting the recessed features of the substrate surface.

14. The method of claim 1, further comprising rising the substrate surface after removing the substrate from the electroless plating bath.

15. The method of claim 1, further comprising rotating the substrate in the electroless plating bath during at least a portion of the contacting.

16. The method of claim 1, wherein at least some of the recesses in said substrate surface have an aspect ratio of at least about 4:1.

17. The process of claim 1, further comprising:
   drying the substrate; and
   electroplating the substrate.

18. A method of filling Damascene features in a partially fabricated integrated circuit, the method comprising:
   (a) immersing the partially fabricated integrated circuit, or at least a portion thereof containing the Damascene features, in an electroless copper plating bath comprising a polymer suppressing molecule;
   (b) removing the partially fabricated integrated circuit, or at least a portion thereof, from the bath after a period of time;
   (c) re-immersing the partially fabricated integrated circuit, or at least a portion thereof containing the Damascene features, in the electroless copper plating bath comprising the polymer suppressing molecule; and
   (d) again removing the partially fabricated integrated circuit, or at least a portion thereof, from the bath after a period of time.

19. The method of claim 18, wherein the polymer suppressing molecule is PEG.

20. The method of claim 19, wherein the polymer suppressing molecule is PEG of molecular weight of between about 200 to 1,000,000.

21. The method of claim 18, wherein the electroless plating process is allowed to continue until the electroless plated copper layer attains a thickness of between about 500-10000 Angstroms.

22. The process of claim 18, further comprising, after at least one of (b) and (d), rising the partially fabricated integrated circuit with water.

23. The process of claim 18, further comprising:
   drying the partially fabricated integrated circuit; and
   electroplating the partially fabricated integrated circuit.

* * * * *

UNITED STATES PATENT AND TRADEMARK OFFICE
CERTIFICATE OF CORRECTION

PATENT NO.        : 7,456,102 B1
APPLICATION NO.   : 11/248860
DATED             : November 25, 2008
INVENTOR(S)       : Varadarajan et al.

It is certified that error appears in the above-identified patent and that said Letters Patent is hereby corrected as shown below:

On the Title Pg Item (57), line 6, change "filing" to --filling--.

(Column 16, line 5) change "rising" to --rinsing--.

(Column 16, line 43) change "rising" to --rinsing--.

Signed and Sealed this

Fifth Day of May, 2009

JOHN DOLL
*Acting Director of the United States Patent and Trademark Office*